United States Patent

Cogburn

[11] Patent Number: 5,825,819
[45] Date of Patent: Oct. 20, 1998

[54] ASYMMETRICAL DIGITAL SUBSCRIBER LINE (ADSL) LINE DRIVER CIRCUIT

[75] Inventor: Onis Cogburn, Del Valle, Tex.

[73] Assignee: Motorola, Inc., Schaumburg, Ill.

[21] Appl. No.: 636,359

[22] Filed: Apr. 23, 1996

[51] Int. Cl.$^6$ .................................................. H04B 3/00
[52] U.S. Cl. ...................... 375/257; 375/258; 379/93.01; 379/399; 330/255; 330/258
[58] Field of Search ...................... 375/220, 257, 375/258, 288, 377; 379/93.01, 93.05, 93.07, 399; 333/99 R; 330/252, 253, 258, 262, 276

[56] References Cited

U.S. PATENT DOCUMENTS

| | | |
|---|---|---|
| 5,235,617 | 8/1993 | Mallard, Jr. .............................. 375/258 |
| 5,287,386 | 2/1994 | Wade et al. .............................. 375/257 |
| 5,381,112 | 1/1995 | Rybicki et al. .......................... 330/253 |
| 5,485,488 | 1/1996 | Van Brunt et al. ...................... 375/257 |

Primary Examiner—Stephen Chin
Assistant Examiner—Amanda T. Le
Attorney, Agent, or Firm—J. Gustav Larson; Daniel D. Hill

[57] ABSTRACT

A differential amplifier (40) receives a low level ADSL signal IN− and IN+ and produces an amplified differential signal. A pair of differential amplifiers (42, 44) receives the differential signal and provides phase shifting and further amplification to the differential signal. A set of differential pairs (46, 48, 50, 52) are coupled to the pair of differential amplifiers (42, 44) and provide further amplification and drive capability to the differential signal. A pair of driver pairs 54 and 56 are coupled to the differential pairs (46, 48, 50, 52) to provide a fully differential output signal OUT− and OUT+ with high linearity. A common mode feedback stage (58) and gain feedback stage (98) provide feedback.

21 Claims, 2 Drawing Sheets

ASYMMETRICAL DIGITAL SUBSCRIBER LINE (ADSL) LINE DRIVER CIRCUIT

FIELD OF THE INVENTION

This invention relates generally to communications, and more particularly, to an asymmetrical digital subscriber line (ADSL) line driver circuit.

BACKGROUND OF THE INVENTION

The North American Integrated Service Digital Network (ISDN) Standard, defined by the American National Standard Institute (ANSI), regulates the protocol of information transmissions over telephone lines. In particular, the ISDN standard regulates the rate at which information can be transmitted and in what format. ISDN allows full duplex digital transmission of two 64 kilo bit per second data channels and greatly exceeds the capabilities of data transmission using conventional analog modems.

In order to make high data rate interactive services such as video conferencing available to more residential and small business customers, high-speed data communication paths are required. Although fiber optic cable is the preferred transmission media for such high data rate services, it is not readily available in existing communications networks, and the expense of installing fiber optic cable is often prohibitive. Current telephone wiring connections, which consist of copper twisted-pair media, are not designed to support the data rates, or bandwidth, required for interactive services. Asymmetric Digital Subscriber Lines (ADSL) technology has been developed to increase the effective bandwidth of existing twisted-pair connections, allowing interactive services to be provided without requiring the installation of new fiber optic cable.

Discrete Multi-Tone (DMT) is a multicarrier technique that divides the available bandwidth of twisted-pair connections into many subchannels. The DMT technique has been adopted by the ANSI T1E1.4 (ADSL) committee for use in ADSL systems. In ADSL, DMT is used to generate 250 separate 4.3125 kHz subchannels from 26 kHz to 1.1 MHz for downstream transmission to the end user, and 26 subchannels from 26 kHz to 138 kHz for upstream transmission by the end user. The transmission capability of the individual subchannels are evaluated for each connection, and data is allocated to the subchannels according to their transmission capabilities (the number of bits each subchannel can support). Subchannels that are not capable of supporting data transmission are not used, whereas the bit-carrying capacity of subchannels that can support transmission is maximized. Thus, by using DMT in an ADSL system, the transmission capability of each twisted-pair connection is maximized over the fixed bandwidth.

Generally, the implementation of the ADSL subchannels occurs in highly integrated digital circuits which provide a low voltage, low current output signal carrying the information for each needed channels. This low level output signal is, generally, interfaced to a twisted pair phone line through an amplification process. In order to operate within the ADSL specification the amplification method used needs to be highly linear across the entire bandwidth of approximately 1.1 MHz.

A known discrete method of amplifying the low level ADSL output signal is to amplify the differential output by using two operational amplifiers that are commonly biased. This method does not produce the desired linearity and it is not fully differential.

Other prior art methods of amplifying analog signals have generally dealt with the amplification of audio or RF telecommunication signals, which do not need the linearity over the increased bandwidth as needed by the ADSL specification. Therefore, the need exists for a highly linear, broad bandwidth, push-pull, fully differential amplifier, suitable for use in ADSL applications.

DESCRIPTION OF A PREFERRED EMBODIMENT

Generally, the present invention amplifies a low level input signal to an intermediate value. The intermediate value is level shifted and amplified again to provide inputs to a series of differential pairs. The differential pairs increase the drive and linearity to a final driver stage, where the final driver stage is fully differential and has high linearity across a wide bandwidth.

Figure 1:
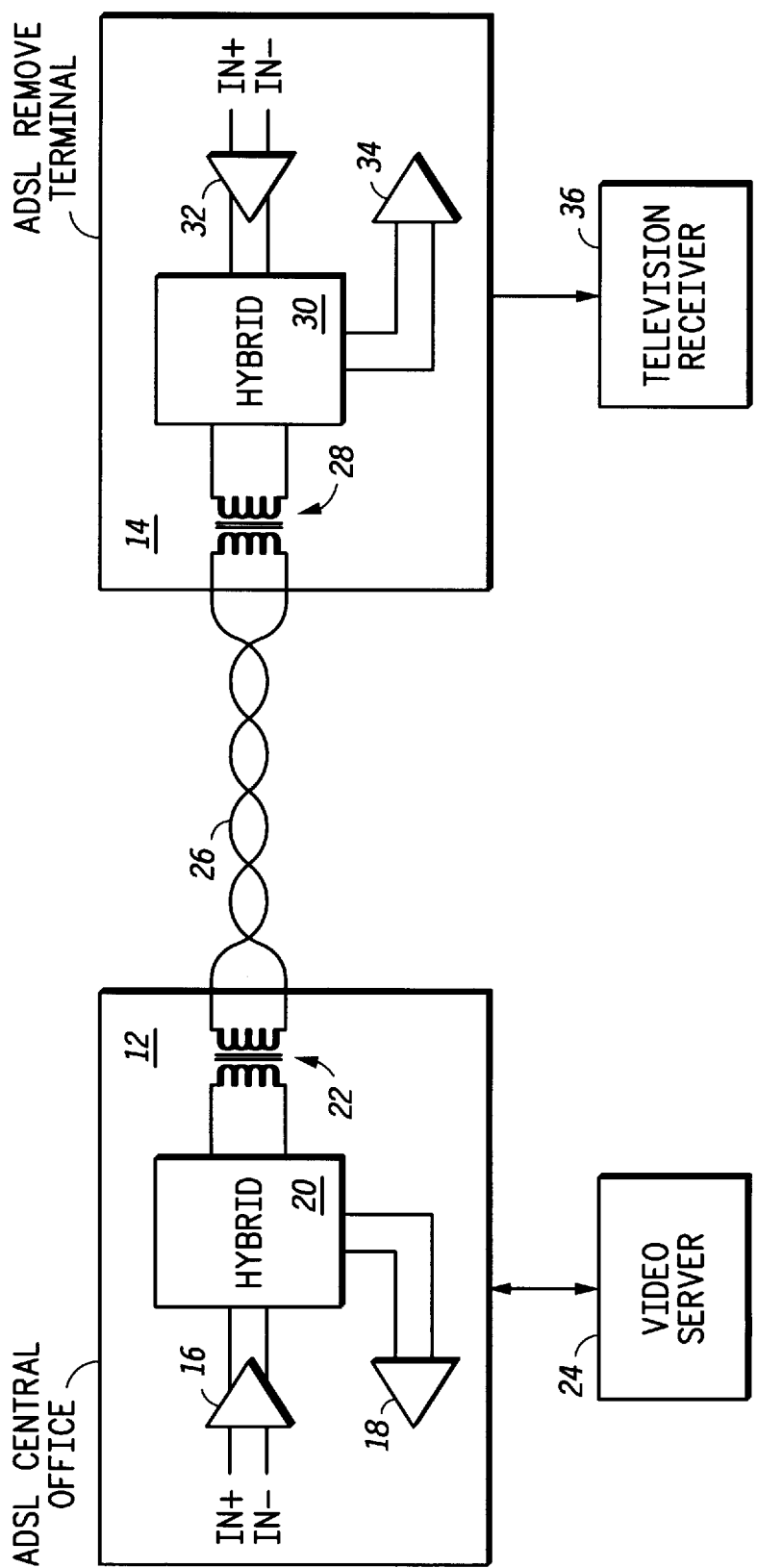
FIG. 1 illustrates, in block diagram form, an Asymmetric Digital Subscriber Line (ADSL) system.

The present invention can be more fully described with reference to FIG. 1 and FIG. 2. FIG. 1 illustrates, in partial block diagram and schematic form, one embodiment of an Asynchronous Digital Subscriber Loop (ADSL) communication system 10. The ADS communication system 10 consists of an ADSL central office 12, an ADSL remote office 14, a twisted pair wire 26, a video server 24, and a television receiver 36. The video server 24 is connected to the ADSL central office 12. The ADSL central office 12 is connected to the twisted pair wire 26. The ADSL remote terminal 14 is coupled to the twisted pair. The Television receiver 36 is connected to the ADSL remote terminal.

In operation, The ADSL central office 12 receives a representation of a video signal from the video server 24. This signal is processed by the ADSL central office 12 to produce an ADSL output signal that conforms with ADSL specifications. The ADSL output signal is driven onto the twisted pair wire 26. The ADSL remote terminal 14 receives the ADSL output signal from the ADSL central office 12. The received signal is processed by the ADSL remote terminal 14, which produces a signal to drive the television receiver 36. In a like manner, a signal may be generated by a television system containing the television receiver 36, processed by the ADSL remote terminal 14, sent to the ADSL central office, and ultimately received by the video server 24. It is understood that the characteristics of the ADSL specification is independent of the data being transmitted.

The ADSL central office 12 comprises an ADSL amplifier 16, a hybrid 20, a transformer 22, and a buffer 18. Likewise, the ADSL remote terminal 14 comprises an ADSL amplifier 32, a hybrid 30, a transformer 28, and a buffer 34.

The differential amplifier 16 receives a differential input from the transmitter portion of an ADSL transceiver. The differential signal input is represented in FIG. 1 by the signals IN+ and IN−. The differential signal received from the transmitter portion of the ADSL system is a low level signal in terms of both voltage swing and current. The differential amplifier 16 provides high gain and linearity across the bandwidth of the ADSL signal. The differential output signal from the differential amplifier 16 is used to drive a transformer capable of driving a twisted pair wire 26. The twisted pair 26 will generally be a telephone line. The differential output from the differential amplifier 16 interfaces to hybrid circuit 20. The hybrid circuit 20 provides a number of functions, one function being to interface the differential output of the ADSL amplifier 16 to the transformer 22. Transformer 22 drives the received differential signal onto the twisted pair wire 26. The hybrid circuit also functions to determine when data is received through the transformer 22, and routes this data to the buffer 18 which interfaces the received signal to the receiver portion an ADSL transceiver (not shown). In addition to allowing the bidirection transmissions across the twisted pair wire 26, the hybrid system 20 provides a splitter to allow operation with a plain old telephone system (POTS).

The signal being transmitted downstream over twisted pair 26 is received at an ADSL remote terminal 14. The ADSL terminal 14 represents a complimentary system to the ADSL central office. While differences may occur in the ADSL remote terminal pursuant to the ADSL specification, the ADSL remote terminal 14 operates in a similar manner as the ADSL central office, and will not be specifically discussed further.

Figure 2:
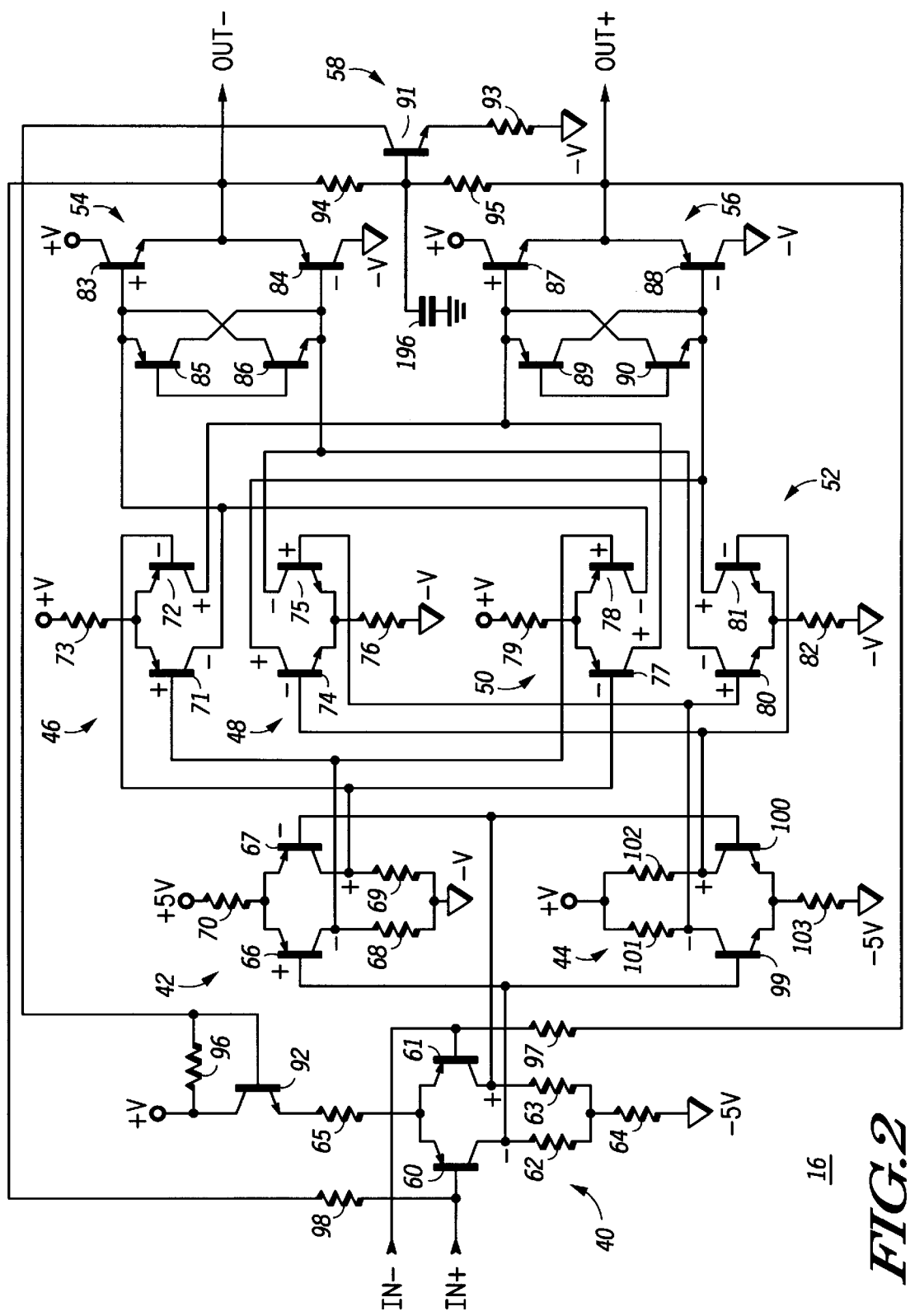
FIG. 2 illustrates, in schematic form, a differential amplifier for use with an ADSL system.

One embodiment of the ADSL line drivers 16 and 32 is illustrated in FIG. 2, in accordance with the present invention. The ADSL line driver 16 (amplifier 16) comprises differential amplifier 40 having a first and a second input terminal and a first and a second output terminal, differential amplifier 42 having a first and a second input terminal and a first and a second output terminal, differential amplifier 44 having a first and a second input terminal and a first and a second output terminal, differential pair 46 having a first and a second input terminal and a first and a second output terminal, differential pair 48 having a first and a second input terminal and a first and a second output terminal, differential pair 50 having a first and a second input terminal and a first and a second output terminal, differential 52 having a first and a second input terminal and a first and a second output terminal, driver pair 54 having a first and a second input terminal and a first and a second output terminal, driver pair 56 each having a first and a second input terminal and an output terminal, and common mode circuit 58 having a first and a second input terminal and a first and an output terminal, and resistors 97 and 98.

Differential amplifier 40 consists of PNP transistors 60 and 61, and resistors 62, 63, 64, and 65. PNP transistor 60 has a base (control electrode) for receiving a signal IN+, an emitter (first circuit node), and a collector (second current node). PNP transistor 61 has an emitter coupled to the emitter of PNP transistor 60, a base electrode for receiving a signal IN–, and a collector. Resistor 63 has a first node (terminal) connected to the collector of PNP transistor 61, and a second node (terminal). Resistor 62 has a first node connected to the collector of PNP transistor 60, and a second node connected to the second node of resistor 63. Resistor 64 has a first node connected to the second node of transistor 62, and a second node connected to a voltage reference of –5 Volts. Resistor 65 has a first node, and a second node coupled to the emitter of transistor 60.

Differential amplifier 42 consists of PNP transistors 66 and 67, and resistors 68, 69, and 70. PNP transistor 66 has a base connected to the collector of PNP transistor 60, an emitter, and a collector. PNP transistor 67 has an emitter coupled to the emitter of PNP transistor 66, a base connected to the collector of PNP transistor 61, and a collector. Resistor 69 has a first node connected to the collector of PNP transistor 67, and a second node connected to a reference voltage of +V. Resistor 68 has a first node connected to the collector of PNP transistor 66, and a second node connected to the second node of resistor 69. Resistor 70 has a first node connected to a voltage reference of +5 volts, and a second node coupled to the emitter of transistor 66.

Differential amplifier 44 consists of NPN transistors 99 and 100, and resistors 101, 102, and 103. NPN transistor 99 has a base connected to the collector of PNP transistor 60, an emitter, and a collector. PNP transistor 100 has an emitter coupled to the emitter of NPN transistor 99, a base connected to the collector of PNP transistor 61, and a collector. Resistor 102 has a first node connected to a reference voltage of +V, and a second node connected to the collector of NPN transistor 100. Resistor 101 has a first node connected to the first node of resistor 69, and a second node connected to the collector of NPN transistor 99. Resistor 103 has a first node connected to the emitter of transistor 99, and a second node connected to a voltage reference of –5 volts.

The differential pair 46 comprises PNP transistors 71 and 72, and resistor 73. PNP transistor 71 has an emitter, a base connected to the collector of PNP transistor 66, and a collector. PNP transistor 72 has an emitter connected to the emitter of PNP transistor 71, a base connected to the collector of PNP transistor 67, and a collector. Resistor 73 has a first node connected to a voltage reference +V, and a second node connected to the emitter of PNP transistor 72.

The differential pair 48 comprises NPN transistors 74 and 75, and resistor 76. NPN transistor 74 has an emitter, a base connected to the collector of NPN transistor 100, and a collector. NPN transistor 75 has an emitter connected to the emitter of NPN transistor 74, a base connected to the collector of NPN transistor 99, and a collector. Resistor 76 has a first node connected to the emitter of NPN transistor 74, and a second node connected to a voltage reference –V.

The differential pair 50 comprises PNP transistors 77 and 78, and resistor 79. PNP transistor 77 has an emitter, a base connected to the collector of PNP transistor 67, and a collector. PNP transistor 78 has an emitter connected to the emitter of PNP transistor 77, a base connected to the collector of PNP transistor 66, and a collector. Resistor 79 has a first node connected to a voltage reference +V, and a second node connected to the emitter of PNP transistor 78.

The differential pair 52 comprises NPN transistors 80 and 81, and resistor 82. NPN transistor 80 has an emitter, a base connected to the collector of NPN transistor 99, and a collector. NPN transistor 81 has an emitter connected to the emitter of NPN transistor 80, a base connected to the collector of NPN transistor 100, and a collector. Resistor 82 has a first node connected to the emitter of NPN transistor 80, and a second node connected to a voltage reference –V.

Driver pair 54 comprises PNP transistors 84 and 85, and NPN 83 and 86 transistors. NPN transistor 83 has a collector connected to a voltage reference +V, a base connected to the collector of PNP transistor 71 and the collector of PNP transistor 78, and an emitter which provides an output OUT–. PNP transistor 84 has an emitter coupled to the emitter of NPN transistor 83, a base connected to the collector of NPN transistor 75 and the collector of NPN transistor 80, and a collector connected to a voltage reference –V. PNP resistor 85 has an emitter coupled to the base of NPN transistor 83, a base, and a collector coupled to the base of PNP transistor 84. NPN transistor 86 has a collector coupled to the base of NPN transistor 83, a base coupled to the base PNP transistor 85, and an emitter coupled to the base of PNP transistor 84. The transistors 85 and 86 form a symetrical diode circuit.

Driver pair 56 comprises PNP transistors 88 and 89, and NPN 87 and 90 transistors. NPN transistor 87 has a collector connected to a voltage reference +V, a base connected to the collector of PNP transistor 72 and the collector of PNP transistor 77, and an emitter which provides an output OUT+. PNP transistor 88 has an emitter coupled to the emitter of NPN transistor 87, a base connected to the collector of NPN transistor 74 and the collector of NPN transistor 81, and a collector coupled to a voltage reference −V. PNP resistor 89 has an emitter coupled to the base of NPN transistor 87, a base, and a collector coupled to the base of PNP transistor 88. NPN transistor 90 has a collector coupled to the base of NPN transistor 87, a base coupled to the base PNP transistor 89, and an emitter coupled to the base of PNP transistor 88. The transistors 89 and 90 form a symetrical diode circuit.

The common mode circuit 58 comprises NPN transistors 91 and 92, resistors 93, 94, 95, and 96, and capacitor 196. NPN transistor 91 has a collector, a base, and an emitter. Resistor 93 has a first node connected to the emitter of NPN transistor 91, and a second node connected to a reference voltage −V. Resistor 94 has a first node connected to the emitter of NPN transistor 83, and a second node connected to the base of NPN transistor 91. Resistor 95 has a first node coupled to the second node of resistor 94, and a second node connected to the emitter of NPN transistor 87. Capacitor 96 has a first node coupled to the second node of resistor 94, and a second node coupled to a ground voltage reference. NPN transistor 92 has a collector connected to a voltage reference +V, a base coupled to the collector of NPN transistor 91, and an emitter coupled to the first node of resistor 65. Resistor 96 has a first node and a second node, the first node connected to the collector of NPN resistor 92, and the second node connected to the base of NPN transistor 92.

The resistor 98 has a second node connected to the emitter of NPN transistor 87, and a first node connected to the base of PNP transistor 60.

The resistor 97 has a first node connected to the emitter of NPN transistor 83, and a second node connected to the base of PNP transistor 61.

In operation, the differential amplifier 40 receives the differential input signals IN− and IN+. The differential amplifier produces an amplified differential output signal. In accordance with the embodiment shown, the differential amplifier is common mode biased to have an output signal with a dc offset value of zero. The output from differential amplifier 40 need further amplification, level shifting, and linearity for an ADSL system.

Differential amplifiers 42 and 44 function to amplify and shift the input signal. The shifting of the input signal is performed in order to produce the differential voltages needed to drive an external line or transformer. The line driver of the present embodiment needs to be capable of producing a differential output signal between +15 volts and −15 volts as represented in FIG. 2 by +V and −V respectively. The outputs from amplifiers 42 do no have the drive capability to drive the output stages directly and meet all of the linearity needs of an ADSL system.

The shifted differential output of differential amplifiers 42 and 44 connected to differential pairs 46, 48, 50, and 52 and provide the drive needed to drive the output stagees 54 and 56. The increased drive is performed by coupling the differential pairs 46 and 50 together substantially in parallel and differential pairs 48 and 52 together substantially in parellel. The differential pair 46 and 50 drives the NPN transistors 83 and 87 of the output drivers 56 and 54 respectively; while the differential pair 48 and 52 drives the PNP transistors 84 and 88 of the output drivesr 54 and 56 respectively. Both output driver 54 and 56 are push-pull output drivers.

The output signal labeled OUT− is fed back through resistor 98 to the IN+ input of amplifier 40, while the output signal labeled OUT+ is fed back through resistor 97 to the IN− input of the amplifier 40. The resistors 97 and 98 perform a feedback function limiting gain in a traditional fashion.

The output from the common mode circuit, the collector of NPN transistor 91, is fed back to the differential amplifier 40, and provides common mode rejection to the differential amplifier 40. The common mode rejection circuit performs common mode rejection between the inputs and the outputs in a normal fashion.

Theoretically, push-pull drivers, such as driver pairs 54 and 56, have one and only one output transistor on at a time. For example, driver pair 54 would have transistor 83, or transistor 84 on at a given time. In reality, however, there is a period of overlap where both output transistor are on. This is required to assure a smooth transition through the cross over area, and that a tri-state condition does not occur on the push-pull output. During this overlap period, where both transistors are on, linearity is affected. In conventional audio applications, or other low bandwidth applications, the linearity can be tolerated. However, in ADSL applications, the distortion introduced during this phase can be significant causing subchannels to be unavailable for the transmission of data. By increasing the drive to the outut transistors 83, 84, 87, and 88, the amount of overlap is kept to a minimum, hence improving linearity of the circuit. This increased linearity allows more of the ADSL subchannels to be used for transmission.

The advent of ADSL systems, and the multiple subcarriers which ADSL uses, requires an amplifier with improved linearity over a greater bandwidth than previous applications require. By allowing for faster transition between the crossover point of the push-pull amplifier, the present invention increases the linearity of the amplifier over the bandwidth needed by an ADSL system The faster transition is facilitated by multiple amplification stages and the increased drive provided by the transistor pairs 46, 48, 50, and 52.

While the invention has been described in the context of a preferred embodiment, it will be apparent to those skilled in the art that the present invention may be modified in numerous ways and may assume many embodiments other than that specifically set out and described above. For example, different feedback circuitry, or common mode biasing circuitry could be used. Accordingly, it is intended by the appended claims to cover all modifications of the invention which fall within the true spirit and scope of the invention.

What is claimed is:

1. A line driver circuit, comprising:

a first differential amplifier having a first input terminal for receiving a first input signal, a second input terminal for receiving a second input signal, a first output terminal, and a second output terminal;

a second differential amplifier having a first input terminal coupled to the second output terminal of the first differential amplifier, a second input terminal coupled to the first output terminal of the first differential amplifier, a first output terminal, and a second output terminal;

a third differential amplifier having a first input terminal coupled to the second output terminal of the first differential amplifier, and a second input terminal coupled to the first output terminal of the first differential amplifier, a first output terminal, and a second output terminal;

a first differential pair having a first input terminal coupled to second output terminal of the second differential amplifier, a second input terminal coupled to the first output terminal of the second differential amplifier, a first output terminal, and a second output terminal;

a second differential pair having a first input terminal coupled to the second output terminal of the third differential amplifier, a second input terminal coupled to the first output terminal of the third differential amplifier, a first output terminal, and a second output terminal;

a third differential pair having a first input terminal coupled to the second output terminal of the second differential amplifier, a second input terminal coupled to the first output terminal of the second differential amplifier, a first output terminal, and a second output terminal;

a fourth differential pair having a first input terminal coupled to the second output terminal of the third differential amplifier, a second input terminal coupled to the first output terminal of the third differential amplifier, a first output terminal, and a second output terminal;

a first driver portion having a first input terminal coupled to both the second output terminal of the first differential pair and the second output terminal of the third differential pair, and a second input terminal coupled to both the second output terminal of the second differential pair and the second output terminal of the fourth differential pair, and an output terminal for providing a first output signal; and a second driver portion having a first input terminal coupled to both the first output terminal of the first differential pair and the first output terminal of the third differential pair, and a second input terminal coupled to both the first output terminal of the second differential pair and the first output terminal of the fourth differential pair, and an output terminal for providing a second output signal.

2. The line driver circuit of claim 1, further comprising a common-mode feedback circuit coupled between the first output terminal and the second output terminal, and the first differential amplifier, for sensing a common-mode voltage of the first output signal and the second output signal, and controlling a common-mode feedback voltage at the first output terminal and the second output terminal of the first differential amplifier.

3. The line driver circuit of claim 2, wherein the common-mode feedback circuit comprises:
   a first transistor having a first current electrode coupled to a first power supply voltage terminal, a control electrode, and a second current electrode coupled to the first differential amplifier;
   a pair of series-connected resistors coupled between the first output terminal and the second output terminal;
   a second transistor having a first current electrode coupled to the control electrode of the first transistor, a control electrode coupled between the pair of series-connected resistors, and a second current electrode;
   a first resistor having a first terminal coupled to the second current electrode of the second transistor, and a second terminal coupled to a second power supply voltage terminal; and
   a capacitor having a first plate electrode coupled to control electrode of the second transistor, and a second plate electrode coupled to ground.

4. The common-mode feedback circuit of claim 3 further comprising a second resistor having a first terminal coupled to the second current electrode of the first transistor, and a second terminal connected to the first differential amplifier.

5. The line driver circuit of claim 1, further comprising:
   a first feedback resistor coupled between the first output terminal of the first driver portion and the first input terminal of the first differential amplifier; and
   a second feedback resistor coupled between the output terminal of the second driver portion and the second input terminal of the first differential amplifier.

6. The line driver circuit of claim 1, wherein the first driver portion comprises:
   an NPN transistor having a collector coupled to a first power supply voltage terminal, a base, and an emitter for providing the first output signal;
   a PNP transistor having an emitter coupled to the emitter of the NPN transistor, a base, and a collector coupled to a second power supply voltage terminal; and
   a symmetrical diode circuit coupled between the bases of the NPN transistor and the PNP transistor.

7. The line driver circuit of claim 1, wherein the first differential amplifier, the second differential amplifier, the first differential pair, and the third differential pair includes PNP transistors, and the second differential amplifier and the second differential pair and the fourth differential pair includes NPN transistors.

8. The line driver circuit of claim 1, wherein the first and second input signals are differential analog input signals and the first and second output signals are differential output analog signals.

9. The line driver circuit of claim 1, wherein the line driver circuit is for driving a plain old telephone system (POTS) in a manner compatible with an asymmetrical digital subscriber line (ADSL) standard.

10. In a communications system compliant with an asymmetrical digital subscriber line (ADSL) communications standard, a differential line driver circuit for driving a transmission line, the differential line driver circuit comprising:
    a first differential amplifier having a first input terminal for receiving a first input signal, a second input terminal for receiving a second input signal, a first output terminal, and a second output terminal;
    a second differential amplifier having a first input terminal coupled to the second output terminal of the first differential amplifier, a second input terminal coupled to the first output terminal of the first differential amplifier, a first output terminal, and a second output terminal
    a third differential amplifier having a first input terminal coupled to the second output terminal of the first differential amplifier, and a second input terminal coupled to the first output terminal of the first differential amplifier, a first output terminal, and a second output terminal;
    a first differential pair having a first input terminal coupled to second output terminal of the second differential amplifier, a second input terminal coupled to the first output terminal of the second differential amplifier, a first output terminal, and a second output terminal;
    a second differential pair having a first input terminal coupled to the second output terminal of the third differential amplifier, a second input terminal coupled to the first output terminal of the third differential amplifier, a first output terminal, and a second output terminal;

a third differential pair having a first input terminal coupled to the second output terminal of the second differential amplifier, a second input terminal coupled to the first output terminal of the second differential amplifier, a first output terminal, and a second output terminal;

a fourth differential pair having a first input terminal coupled to the second output terminal of the third differential amplifier, a second input terminal coupled to the first output terminal of the third differential amplifier, a first output terminal, and a second output terminal;

a first driver portion having a first input terminal coupled to both the second output terminal of the first differential pair and the second output terminal of the third differential pair, and a second input terminal coupled to both the second output terminal of the second differential pair and the second output terminal of the fourth differential pair, and an output terminal for providing a first output signal; and a second driver portion having a first input terminal coupled to both the first output terminal of the first differential pair and the first output terminal of the third differential pair, and a second input terminal coupled to both the first output terminal of the second differential pair and the first output terminal of the fourth differential pair, and an output terminal for providing a second output signal;

a first feedback resistor coupled between the first output terminal of the first driver portion and the first input terminal of the first differential amplifier; and a second feedback resistor coupled between the output terminal of the second driver portion and the second input terminal of the first differential amplifier.

11. The differential line driver circuit of claim 10, further comprising a common-mode feedback circuit coupled between the first output terminal and the second output terminal, and the first differential amplifier, for sensing a common-mode voltage of the first output signal and the second output signal, and controlling a common-mode feedback voltage at the first output terminal and the second output terminal of the first differential amplifier.

12. The differential line driver circuit of claim 11, wherein the common-mode feedback circuit comprises:

a first transistor having a first current electrode coupled to a first power supply voltage terminal, a control electrode, and a second current electrode coupled to the first differential amplifier;

a pair of series-connected resistors coupled between the first output terminal and the second output terminal;

a second transistor having a first current electrode coupled to the control electrode of the first transistor, a control electrode coupled between the pair of series-connected resistors, and a second current electrode;

a first resistor having a first terminal coupled to the second current electrode of the second transistor, and a second terminal coupled to a second power supply voltage terminal; and a capacitor having a first plate electrode coupled to control electrode of the second transistor, and a second plate electrode coupled to ground.

13. The differential line driver circuit of claim 10, wherein the first input signal and the second input signal are differential analog input signals and the first and second output signals are differential output analog signals.

14. The communications system of claim 10, wherein the first differential amplifier, the second differential amplifier, the first differential pair, and the third differential pair includes PNP transistors, and the second differential amplifier and the second differential pair and fourth differential pair includes NPN transistors.

15. The communications system of claim 10, wherein the first driver portion comprises:

an NPN transistor having a collector coupled to a first power supply voltage terminal, a base, and an emitter for providing the first output signal;

a PNP transistor having an emitter coupled to the emitter of the NPN transistor, a base, and a collector coupled to a second power supply voltage terminal; and a symmetrical diode circuit coupled between the bases of the NPN transistor and the PNP transistor.

16. In a communications system compliant with an asymmetrical digital subscriber line (ADSL) communications standard, a differential line driver circuit for driving a transmission line, the differential line driver circuit comprising:

a first differential amplifier having a first input terminal for receiving a first input signal, a second input terminal for receiving a second input signal, a first output terminal, and a second output terminal;

a second differential amplifier having a first input terminal coupled to the second output terminal of the first differential amplifier, a second input terminal coupled to the first output terminal of the first differential amplifier, a first output terminal, and a second output terminal a third differential amplifier having a first input terminal coupled to the second output terminal of the first differential amplifier, and a second input terminal coupled to the first output terminal of the first differential amplifier, a first output terminal, and a second output terminal;

a first differential pair having a first input terminal coupled to second output terminal of the second differential amplifier, a second input terminal coupled to the first output terminal of the second differential amplifier, a first output terminal, and a second output terminal;

a second differential pair having a first input terminal coupled to the second output terminal of the third differential amplifier, a second input terminal coupled to the first output terminal of the third differential amplifier, a first output terminal, and a second output terminal;

a third differential pair having a first input terminal coupled to the second output terminal of the second differential amplifier, a second input terminal coupled to the first output terminal of the second differential amplifier, a first output terminal, and a second output terminal;

a fourth differential pair having a first input terminal coupled to the second output terminal of the third differential amplifier, a second input terminal coupled to the first output terminal of the third differential amplifier, a first output terminal, and a second output terminal;

a first driver portion having a first input terminal coupled to both the second output terminal of the first differential pair and the second output terminal of the third differential pair, and a second input terminal coupled to both the second output terminal of the second differential pair and the second output terminal of the fourth differential pair, and an output terminal for providing a first output signal;

a second driver portion having a first input terminal coupled to both the first output terminal of the first differential pair and the first output terminal of the third differential pair, and a second input terminal coupled to both the first output terminal of the second differential pair and the first output terminal of the fourth differential pair, and an output terminal for providing a second output signal; and a common-mode feedback circuit coupled between the first output terminal and the second output terminal, and the first differential amplifier, for sensing a common-mode voltage of the first output signal and the second output signal, and controlling a common-mode feedback voltage at the first output terminal and the second output terminal of the first differential amplifier.

17. The communications system of claim 16, wherein the common-mode feedback voltage is equal to about zero volts.

18. The communications system of claim 16, wherein the first driver portion comprises:

an NPN transistor having a collector coupled to a first power supply voltage terminal, a base, and an emitter for providing the first output signal;

a PNP transistor having an emitter coupled to the emitter of the NPN transistor, a base, and a collector coupled to a second power supply voltage terminal; and a symmetrical diode circuit coupled between the bases of the NPN transistor and the PNP transistor.

19. The communications system of claim 16, wherein the first differential amplifier, the second differential amplifier, the first differential pair, and the third differential pair includes PNP transistors, and the second differential amplifier and the second differential pair and fourth differential pair includes NPN transistors.

20. The differential line driver circuit of claim 16, wherein the common-mode feedback circuit comprises:

a first transistor having a first current electrode coupled to a first power supply voltage terminal, a control electrode, and a second current electrode coupled to the first differential amplifier;

a pair of series-connected resistors coupled between the first output terminal and the second output terminal;

a second transistor having a first current electrode coupled to the control electrode of the first transistor, a control electrode coupled between the pair of series-connected resistors, and a second current electrode;

a first resistor having a first terminal coupled to the second current electrode of the second transistor, and a second terminal coupled to a second power supply voltage terminal; and a capacitor having a first plate electrode coupled to control electrode of the second transistor, and a second plate electrode coupled to ground.

21. The differential line driver circuit of claim 16, wherein the first input signal and the second input signal are differential analog input signals and the first output signal and the second output signal are differential output analog signals.

* * * * *